United States Patent
Iwamoto et al.

(10) Patent No.: US 6,867,849 B2
(45) Date of Patent: Mar. 15, 2005

(54) STAGE APPARATUS WHICH SUPPORTS INTERFEROMETER, STAGE POSITION MEASUREMENT METHOD, PROJECTION EXPOSURE APPARATUS, PROJECTION EXPOSURE APPARATUS MAINTENANCE METHOD, SEMICONDUCTOR DEVICE MANUFACTURING METHOD, AND SEMICONDUCTOR MANUFACTURING FACTORY

(75) Inventors: Kazunori Iwamoto, Tochigi (JP); Toshiya Asano, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 128 days.

(21) Appl. No.: 09/866,600

(22) Filed: May 30, 2001

(65) Prior Publication Data

US 2002/0008877 A1 Jan. 24, 2002

(30) Foreign Application Priority Data

Jun. 1, 2000 (JP) .................................... 2000-164879

(51) Int. Cl.⁷ ......................... G03B 27/62; G03B 27/58
(52) U.S. Cl. ............................................. 355/75; 355/72
(58) Field of Search ........................... 355/53, 72–76; 356/509, 900; 378/34, 35; 318/649; 74/490.09

(56) References Cited

U.S. PATENT DOCUMENTS

| | | | | |
|---|---|---|---|---|
| 5,168,512 A | | 12/1992 | Iwamoto et al. | 378/34 |
| 5,243,377 A | * | 9/1993 | Umatate et al. | 355/53 |
| 5,724,136 A | * | 3/1998 | Zanoni | 356/349 |
| 5,757,160 A | * | 5/1998 | Kreuzer | 318/649 |
| 6,008,885 A | | 12/1999 | Takahashi et al. | 355/67 |
| 6,069,683 A | | 5/2000 | Iwamoto | 355/53 |
| 6,130,490 A | * | 10/2000 | Lee | 310/12 |
| 6,363,809 B1 | * | 4/2002 | Novak et al. | 74/490.09 |

FOREIGN PATENT DOCUMENTS

JP    5-217837    *    8/1993

* cited by examiner

*Primary Examiner*—Henry Hung Nguyen
(74) *Attorney, Agent, or Firm*—Fitzpatrick, Cella, Harper & Scinto

(57) ABSTRACT

A stage apparatus includes a stage movable along at least one axis, a laser head for generating a laser beam, an optical unit which is mounted on the stage and splits the laser beam into reference and measurement beams, a mirror which is arranged outside the stage and reflects the measurement beam, and a detector which is arranged outside the stage and detects an interference beam of the reference and measurement beams.

30 Claims, 11 Drawing Sheets

FIG. 9

| URL | http://www.maintain.co.jp/db/input.html |

TROUBLE DB INPUT WINDOW

OCCURRENCE DATE [2000/3/15] ~404
TYPE OF APPARATUS [**********] ~401
SUBJECT [OPERATION ERROR (START-UP ERROR)] ~403
APPARATUS S/N [465NS4580001] ~402
DEGREE OF URGENCY [D] ~405
SYMPTOM [LED KEEPS FLICKERING AFTER POWER-ON] ~406
REMEDY [POWER ON AGAIN (PRESS RED BUTTON IN ACTIVATION)] ~407
PROGRESS [INTERIM HAS BEEN DONE] ~408

[SEND] [RESET]   410   411   412
LINK TO RESULT LIST DATABASE   SOFTWARE LIBRARY   OPERATION GUIDE

SEMICONDUCTOR DEVICE MANUFACTURING FLOW

STAGE APPARATUS WHICH SUPPORTS INTERFEROMETER, STAGE POSITION MEASUREMENT METHOD, PROJECTION EXPOSURE APPARATUS, PROJECTION EXPOSURE APPARATUS MAINTENANCE METHOD, SEMICONDUCTOR DEVICE MANUFACTURING METHOD, AND SEMICONDUCTOR MANUFACTURING FACTORY

FIELD OF THE INVENTION

The present invention relates to a stage apparatus which supports an interferometer for measuring the position of a stage movable in at least one axial direction by using a laser interferometer and, more particularly, to a stage apparatus which supports an interferometer for measuring the position of a stage having long and short stroke axes by using a laser interferometer. Also, the present invention relates to a projection exposure apparatus having this stage as a reticle stage and/or wafer stage, and a method of manufacturing a semiconductor device or the like by using the projection exposure apparatus.

BACKGROUND OF THE INVENTION

Conventionally, in the technical field which requires high-precision processing, various processing operations are done by setting an object to be processed on a stage which can be aligned at high precision, and controlling the stage. The prior art will be described by exemplifying a projection exposure apparatus used in the manufacture of a semiconductor device or the like.

In the projection exposure apparatus, a reticle stage, which supports a reticle, or a wafer stage, which supports a wafer, must be moved parallel to planes perpendicular to each other along the X- and Y-axes in exposure, and the stage position must be accurately measured and controlled. For this purpose, the projection exposure apparatus uses a laser interferometer as a means for measuring the positions of X and Y strokes on the reticle or wafer stage in the $\mu$ order or less.

In general, the reticle or wafer stage slightly rotates within the X- and Y-axis planes (θ-axis direction) (yawing error). The yawing error generated in the reticle or wafer stage also slightly rotates a reticle or wafer set on the stage along the θ-axis, and an error at the periphery cannot be ignored. Therefore, this yawing error must be corrected. For example, a laser interferometer obtains the X-direction positions of two points on the reticle or wafer stage, and a θ-axis displacement is measured from the difference between the positions of the two points and the beam span of the laser interferometer. In this manner, on the reticle or wafer stage, the X-axis position of one point and the Y-axis positions of two points on the stage are generally measured by using the laser interferometer in order to measure X-, Y-, and θ-axis positions.

FIG. 5 is a view showing a measurement principle using a laser interferometer. A bar mirror on an X-Y stage 12 is irradiated with a laser beam from the Y-axis direction, and measurement is done by using the reflected beam. When either of the X and Y strokes is longer, for example, when the Y-axis stroke is longer, as shown in FIG. 5, a bar mirror for measuring an X-axis position inevitably becomes longer along the Y-axis. A long bar mirror makes the apparatus bulky. In addition, a cantilever structure generates deflection and vibrations of the bar mirror itself.

To prevent this, a bar mirror is eliminated from an X-Y stage in the invention disclosed in Japanese Patent Laid-Open No. 5-217837. This X-Y stage will be described with reference to FIG. 6.

In FIG. 6, an X-Y stage 12 comprises a rectangular Y table 14 movable in the Y-axis direction along a pair of rails 13 extending parallel to the Y-axis, and a rectangular X table 16 movable in the X-axis direction along a pair of rails 15 laid parallel to the X-axis on the Y table 14. A wafer W is held on the X table 16.

A laser interferometer is generally constituted by an optical unit which receives a laser beam from a light source, splits it into reference and measurement beams, ensures the optical path of the reference beam, and causes the reference and measurement beams to interfere with each other, a bar mirror for reflecting the measurement beam, a detector for detecting the interference beam, and the like.

A laser head 8 for generating a laser beam, benders for deflecting the optical path of the laser beam, beam splitters located between the benders to split the laser beam, optical units (interferometers) 9a, 9b, and 9c each for splitting the laser beam into reference and measurement beams and ensuring the optical path of the reference beam, and detectors 10a, 10b, and 10c each for detecting the reference and measurement beams are arranged outside the X-Y stage 12. Bar mirrors 11a and 11b for reflecting the measurement beams of laser beams and returning them to the optical units (interferometers) 9a, 9b, and 9c are fixed at the edges of two sides which face the optical units (interferometers) 9a, 9b, and 9c and are perpendicular to each other, thus constituting a laser interferometer.

This laser interferometer measures the positions of the X and Y tables 16 and 14 and the position of the wafer W. A laser beam emitted by the laser head 8 is deflected by the bender and split into two laser beams by the beam splitter. One of the split laser beams is guided to the optical unit (interferometer) 9a where the laser beam is split into reference and measurement beams. The reference beam is repetitively reflected within the interferometer 9a and guided to the detector 10a. The measurement beam emerges from the optical unit (interferometer) 9a, reaches the bar mirror 11a held by the X table 16, and is reflected to return to the optical unit (interferometer) 9a. The measurement beam reaches the bar mirror 11a again, is reflected, and guided to the detector 10a via the optical unit (interferometer) 9a.

The optical path until the reference beam is incident on the detector 10a is constant regardless of the position of the Y table 14. The optical path until the measurement beam is incident on the detector 10a depends on the Y-axis position of the bar mirror 11a on the X table 16 that reflects the measurement beam, and the measurement beam includes position information of the Y table 14. These optical paths are compared to measure a distance y between the optical unit (interferometer) 9a along the Y-axis and the bar mirror 11a at a point A where the bar mirror 11a held by the X table 16 reflects the measurement beam, and the position of the Y table 14. The other laser beam split by the beam splitter is split into two laser beams by another beam splitter. One of the split laser beams is directly guided to one of the optical units (interferometers) 9b and 9c, whereas the other is deflected in its optical path by another bender and guided to the other optical unit (interferometer). Each of the laser beams guided to the optical units (interferometers) 9b and 9c is split into reference and measurement beams. The measurement beams reciprocate twice between the optical units (interferometers) 9b and 9c and the bar mirror 11b, and the reference beams are repetitively reflected within the respective optical units (interferometers) 9b and 9c. Then, the reference and measurement beams are guided to the detectors 10b and 10c. Distances x1 and x2 between the optical units (interferometers) 9b and 9c and the bar mirror 11b along the X-axis at points B and C where the bar mirror 11b held by the X table 16 reflects the laser beams, and the position of the X table 16 including the two points can be measured from the reference and measurement beams guided to the detectors 10b and 10c.

The X-axis positions (distances) x1 and x2 of two points on the X table 16 and the Y-axis position (distance) y of one point can provide the position of the X-Y stage 12 and the X-, Y-, and θ-axis positions of the wafer W. In Japanese Patent Laid-Open No. 5-217837, the bar mirrors are arranged on the sides of respective tables in their movement directions on the X-Y stage for measuring the positions of the tables by using the laser interferometer and the bar mirrors for reflecting a laser beam from the laser interferometer. At the same time, the optical units (interferometers) of the laser interferometer are held at side edges facing the bar mirrors of the X table.

In Japanese Patent Laid-Open No. 5-217837, the X-Y stage can be downsized by arranging the bar mirrors outside the stage movable portion. However, the detectors are arranged on the stage movable portion, so optical fibers must be laid out on the stage, complicating the wiring of the moving stage.

SUMMARY OF THE INVENTION

The present invention has been made to overcome the conventional drawbacks, and has as its object to provide a movable stage apparatus which can be downsized as a whole and realizes high-precision measurement by a laser interferometer.

The present inventor has made extensive studies to find that the above problem can be solved by mounting the optical unit of at least one laser interferometer on a stage movable portion.

More specifically, a stage apparatus according to the present invention comprises a stage movable along at least one axis, a laser head for generating a laser beam, an optical unit which is mounted on the stage and splits the laser beam into reference and measurement beams, a mirror which is arranged outside the stage and reflects the measurement beam, and a detector for detecting an interference beam of the reference and measurement beams. The optical unit can make the reference and measurement beams interfere with each other. Alternatively, the detector can make the reference and measurement beams interfere with each other.

In the stage apparatus of the present invention, a direction of the laser beam and a direction of the measurement beam from the optical unit that irradiates the mirror are preferably perpendicular to each other.

In the stage apparatus of the present invention, the stage is movable along X- and Y-axes. The stage can be longer in movement stroke along the Y-axis than along the X-axis. The direction of the laser beam can be parallel to the Y-axis, and the measurement beam can be parallel to the X-axis. The stage is movable along a Z-axis. The stage apparatus can further comprise an optical unit for emitting a measurement beam along the Z-axis. The stage is movable along the Z-axis.

In the stage apparatus of the present invention, a reflecting member for reflecting the measurement beam emitted from the Y-axis direction can be mounted on the stage. The measurement beam which irradiates the stage from the Y-axis direction can include a plurality of beams. A Z-axis position of the stage can be measured by using the measurement beam which irradiates the stage from the Y-axis direction. Further, an X-axis position of the stage can be measured by using the measurement beam which irradiates the stage from the Y-axis direction.

In the stage apparatus of the present invention, a plurality of optical units for irradiating the mirror with the measurement beam can be mounted on the stage. The Z-axis position of the stage can be measured by using the measurement beam from the optical unit that irradiates the mirror. The Y-axis position of the stage can be measured by using the measurement beam from the optical unit that irradiates the mirror.

In the stage apparatus of the present invention, a shape of the mirror arranged outside the stage can be measured based on pieces of Y-axis position information of at least two points on the stage, and pieces of X-axis position information of at least two points on the stage that are measured by using the plurality of optical units. The X-axis position information on the stage that is measured by using the optical unit can be corrected based on a measurement result of the shape of the mirror.

In the stage apparatus of the present invention, positions of six axes of the stage can be measured by using a laser beam. The mirror arranged outside the stage is preferably supported at a Bessel point of the mirror.

In the stage apparatus of the present invention, a driving mechanism for driving the stage is controlled based on a measurement result of a position of the stage.

In the stage apparatus of the present invention, the stage can include a reticle stage which supports a reticle.

A stage position measurement method according to the present invention comprises the steps of generating a laser beam from a laser head, irradiating an optical unit mounted on a movable stage with the laser beam, splitting the laser beam into reference and measurement beams by the optical unit, irradiating a mirror arranged outside the stage with the measurement beam, reflecting the measurement beam which irradiates the mirror, making the reflected measurement beam interfere with the reference beam, detecting an interference beam, and measuring a position of the stage on the basis of a signal concerning the detected interference beam.

A projection exposure apparatus according to the present invention can comprise the stage apparatus as a reticle stage and/or a wafer stage.

A semiconductor device manufacturing method according to the present invention comprises the steps of installing manufacturing apparatuses for performing various processes, including the projection exposure apparatus, in a semiconductor manufacturing factory, and manufacturing a semiconductor device by using the manufacturing apparatuses in a plurality of processes. The method can further comprise the steps of connecting the manufacturing apparatuses by a local area network, and communicating information about at least one of the manufacturing apparatuses between the local area network and an external network outside the semiconductor manufacturing factory. A database provided by a vendor or user of the projection exposure apparatus can be accessed via the external network to obtain maintenance information of the manufacturing apparatus by data communication, or production management can be performed by data communication between the semiconductor manufacturing factory and another semiconductor manufacturing factory via the external network.

A semiconductor manufacturing factory according to the present invention comprises manufacturing apparatuses for performing various processes, including the projection exposure apparatus, a local area network for connecting the manufacturing apparatuses, and a gateway which allows the local area network to access an external network outside the factory, wherein information about at least one of the manufacturing apparatuses can be communicated.

A maintenance method for the projection exposure apparatus installed in a semiconductor manufacturing factory comprises the steps of causing a vendor or user of the exposure apparatus to provide a maintenance database connected to an external network of the semiconductor manufacturing factory, authorizing access from the semiconductor manufacturing factory to the maintenance database via the external network, and transmitting maintenance information accumulated in the maintenance database to the semiconductor manufacturing factory via the external network.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such an example, however, is not exhaustive of the various embodiments of the invention, and therefore, reference is made to the claims which follow the description for determining the scope of the invention.

BRIEF DESCRIPTION OF THE DRAWINGS

FIG. 9 is a view showing an example of a user interface;

DETAILED DESCRIPTION OF THE PREFERRED EMBODIMENTS

Preferred embodiments of a stage apparatus which supports an interferometer according to the present invention will be described with reference to FIGS. 1 to 3.
(First Embodiment)

Figure 1:
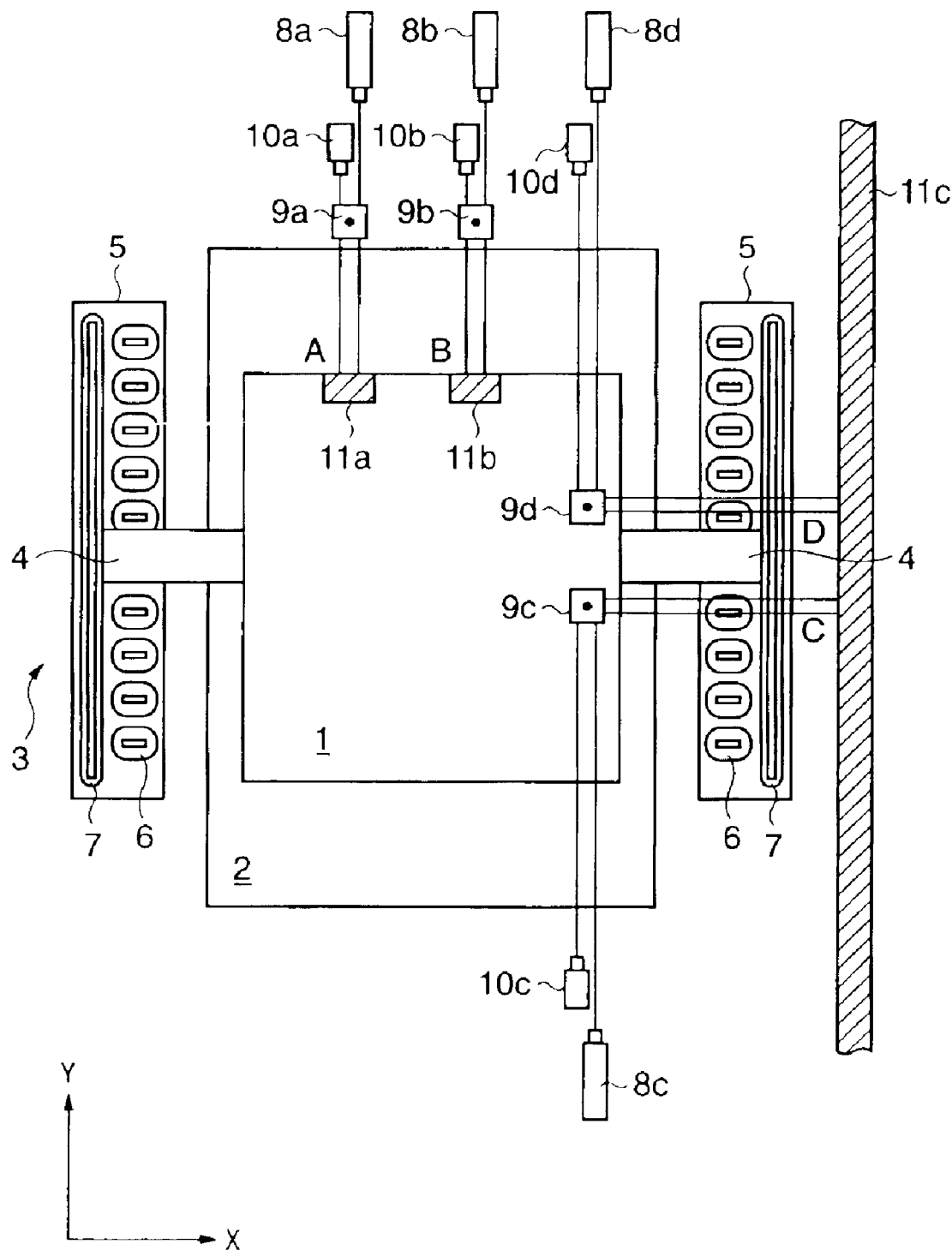
FIG. 1 is a view showing a stage apparatus according to the first embodiment of the present invention.

FIG. 1 shows a stage apparatus which is a triaxial stage having X-, Y-, and θ-axes with a degree of freedom in the plane direction. In this stage apparatus, the stroke is long along the Y-axis, and short along the θ-axis and the X-axis perpendicular to the Y-axis. The bar mirror of a laser interferometer for measuring the long-stroke axis (Y-axis) is mounted on a stage movable portion, and its optical unit and detector are arranged outside the stage movable portion. The optical unit of a laser interferometer for measuring the short-stroke axes (X- and θ-axis) is mounted on a stage movable portion, and its bar mirror and detector are arranged outside the stage movable portion.

In FIG. 1, a reticle stage 1 is supported on a guide 2 in a non-contact manner by a hydrostatic bearing (not shown) so as to be movable along the three, X-, Y-, and θ-axes. The reticle stage 1 supports a reticle (not shown), and is driven by linear motors 3 serving as a driving mechanism with a long stroke along the Y-axis and a short stroke along the X- and θ-axes. The linear motors 3 are arranged on the two sides of the reticle stage 1.

Each linear motor 3 has movable and stationary elements 4 and 5 integrated into the reticle stage 1. The movable element 4 has a Y magnet (not shown) and an X magnet. The stationary element 5 has a plurality of Y coils 6 aligned along the Y-axis, and an X coil 7 as a single phase coil. The Y magnet faces the Y coils 6. A current flowing through a selected Y coil 6 allows the movable element 4 to obtain a driving force in the Y direction. If the two linear motors apply a driving force in a direction opposite to the Y direction, the reticle stage 1 can obtain a driving force in the θ-axis direction. The X magnet faces the X coil 7. A current flowing through the X coil 7 allows the movable element to obtain a driving force in the X direction.

A laser interferometer is generally constituted by an optical unit which receives a laser beam from a light source, splits it into reference and measurement beams, ensures the optical path of the reference beam, and causes the reference and measurement beams to interfere with each other, a bar mirror for reflecting the measurement beam, a detector for detecting the interference beam, and the like.

Laser heads 8a and 8b each for generating a laser beam, optical units (interferometers) 9a and 9b each for splitting the laser beam into reference and measurement beams and ensuring the optical path of the reference beam, and detectors 10a and 10b each for detecting the reference and measurement beams are arranged outside the reticle stage 1. Bar mirrors 11a and 11b for reflecting the measurement beams of laser beams and returning them to the optical units (interferometers) 9a and 9b are fixed at one side edge which faces the optical units (interferometers) 9a and 9b of the reticle stage 1, thus constituting a Y-axis laser interferometer. Note that the members (11a and 11b) for reflecting the measurement beams are not limited to the bar mirrors and may be corner cubes. The bar mirrors 11a and 11b are long enough for the measurement beams not to fall outside them even if the reticle stage 1 moves with a short stroke along the X-axis.

Laser heads 8c and 8d each for generating a laser beam, and detectors 10c and 10d each for detecting reference and measurement beams are arranged outside the reticle stage 1. Optical units (interferometers) 9c and 9d each for splitting a laser beam into reference and measurement beams and ensuring the optical path of the reference beam are mounted on the reticle stage 1. The reticle stage 1 moves with a short stroke along the X-axis. Even if the reticle stage 1 moves along the X-axis, laser beams from the laser heads 8c and 8d do not fall outside the optical units (interferometers) mounted on the reticle stage 1.

A long bar mirror 11c which extends along the Y-axis, faces the optical units (interferometers) 9c and 9d, and reflects the measurement beam of a laser beam to return it to the optical units (interferometers) 9c and 9d is fixed outside the reticle stage 1, thereby constituting an X-axis laser interferometer. The bar mirror 11c is desirably supported at its Bessel point because it is long along the Y-axis.

These Y-axis and X-axis laser interferometers measure the position of the reticle stage 1 and that of a set reticle (not shown). More specifically, laser beams emitted by the laser heads 8a, 8b, 8c, and 8d are guided to the optical units (interferometers) 9a, 9b, 9c, and 9d where each laser beam is split into reference and measurement beams. The reference beams are repetitively reflected within the interferometers 9a, 9b, 9c, and 9d and guided to the detectors 10a, 10b, 10c, and 10d. The measurement beams emerge from the optical units (interferometers) 9a, 9b, 9c, and 9d, reach the bar mirrors 11a and 11b held by the reticle stage 1 and the bar mirror 11c arranged outside the reticle stage 1, and are reflected to return to the optical units (interferometers) 9a, 9b, 9c, and 9d. The measurement beams reach the bar mirrors 11a, 11b, and 11c again, are reflected, and guided to the detectors 10a, 10b, 10c, and 10d via the optical units (interferometers) 9a, 9b, 9c, and 9d.

The optical paths until the reference beams are incident on the detectors 10a and 10b are constant regardless of the position of the reticle stage. The optical paths until the measurement beams are incident on the detectors 10a and 10b depend on the Y-axis positions of the bar mirrors 11a and 11b on the reticle stage 1 that reflect the measurement beams, and the measurement beams contain position information of the reticle stage 1. These optical paths are compared to measure distances y between the optical units (interferometers) 9a and 9b along the Y-axis and the bar mirrors 11a and 11b at points A and B where the bar mirrors 11a and 11b held by the reticle stage 1 reflect the measurement beams, and the position of the reticle stage 1.

Laser beams from the laser heads 8c and 8d are respectively guided to the optical units (interferometers) 9c and 9d. Each of the laser beams guided to the optical units (interferometers) 9c and 9d is split into reference and measurement beams. The measurement beams reciprocate twice between the optical units (interferometers) 9c and 9d and the bar mirror 11c, and the reference beams are repetitively reflected within the respective optical units (interferometers) 9c and 9d. Then, the reference and measurement beams are guided to the detectors 10c and 10d. Distances x1 and x2 between the optical units (interferometers) 9c and 9d and the bar mirror 11c along the X-axis at points C and D where the bar mirror 11c reflects the laser beams, and the position of the reticle stage 1 including the two points can be measured from the reference and measurement beams guided to the detectors 10c and 10d.

In the above description, the optical units 9c and 9d mounted on the reticle stage 1 are interferometers where reference and measurement beams interfere with each other, and the interference beams irradiate the detectors 10c and 10d. However, the first embodiment suffices to split a laser beam into reference and measurement beams on the reticle stage 1, and need not always make the reference and measurement beams interfere with each other on the reticle stage 1. For example, the optical units mounted on the reticle stage 1 may only multiplex reference and measurement beams without making them interfere with each other, and the detectors 10c and 10d arranged outside the reticle stage 1 may make the reference and measurement beams interfere with each other.

The X-axis positions (distances) x1 and x2 of two points on the reticle stage 1 and the Y-axis positions (distances) y1 and y2 of two points can provide the position of the reticle stage 1 and the X-, Y-, and θ-axis positions of the reticle.

The X-axis position of the reticle stage 1 is obtained from x1 and x2, but their average may be used as the X-axis position of the reticle stage 1. Similarly, the Y-axis position of the reticle stage 1 is obtained from y1 and y2, but their average may be used as the Y-axis position of the reticle stage 1. The θ-axis position of the reticle stage 1 is obtained from the positions x1 and x2 and the beam span, but is also to be obtained from the positions y1 and y2 and the beam span. Thus, θ-direction position information measured by the two methods may be averaged.

In FIG. 1, the X- and Y-axis directions are respectively measured by the two optical units (interferometers) 9a and 9b and the two optical units (interferometers) 9c and 9d, but both or one of the X- and Y-axis directions can also be measured by one optical unit. If the interferometer using one of the optical units (interferometers) 9c and 9d is eliminated from the arrangement of FIG. 1, the position of the reticle stage 1 along the three axes (X-, Y-, and θ-axes) can be measured.

The θ-direction position of the reticle stage can be calculated from the Y-axis positions y1 and y2 of two points on the reticle stage 1 and their spans, and the shape of the bar mirror 11c can be measured based on the calculated value and the positions x1 and x2. For this reason, the shape of the bar mirror 11c may be measured in advance to correct the measurement results of x1 and x2 serving as pieces of X-axis position information of two points on the reticle stage 1 on the basis of the measurement result.

To measure the X-axis position of the reticle stage by using the bar mirror 11c, the optical units (interferometers) 9c and 9d each for splitting a laser beam into reference and measurement beams and ensuring the optical path of the reference beam may not be mounted on the reticle stage 1 but may be arranged outside the stage. In this case, the reticle stage 1 is equipped with an optical element for irradiating the bar mirror 11c with a measurement beam from the optical unit (interferometer) that is incident from the Y-axis direction, and returning a measurement beam from the X-axis direction that is reflected by the bar mirror 11c to the optical unit (interferometer). In this arrangement, however, the optical path of the measurement beam is long, and a fluctuation in the atmosphere around the optical path caused by a temperature change generates a large measurement error. That is, the measurement result is readily influenced by the fluctuation because the optical path until the reference beam is incident on the detector is constant, but the measurement beam split by the optical unit (interferometer) arranged outside the reticle stage 1 reaches the optical element mounted on the reticle stage via a long-stroke optical path along the Y-axis, is reflected by the bar mirror 11c to return to the optical element again, and reaches the optical unit via the long-stroke optical path along the Y-axis.

To the contrary, in the embodiment of FIG. 1, the optical units (interferometers) are mounted on the stage. Even if the atmosphere fluctuates between the laser heads 8c and 8d and the optical units (interferometers) 9c and 9d, the measurement result is hardly influenced. This is because an optical path common to the reference and measurement beams is formed between the laser heads 8c and 8d and the optical units (interferometers) 9c and 9d (in other words, the optical path of the interference beam of the reference and measurement beams is formed between the laser heads 8c and 8d and the optical units (interferometers) 9c and 9d).

When, therefore, the X-axis position of the reticle stage 1 is measured by using the bar mirror 11c arranged outside the reticle stage, the measurement precision is higher in the arrangement in which the optical units (interferometers) are mounted on the reticle stage, as shown in FIG. 1, than in the arrangement in which they are arranged outside the reticle stage.

According to the first embodiment, the position of the reticle stage can be measured at high precision, and the stage can be aligned at high precision by controlling based on this measurement result the linear motors for driving the stage.

According to the first embodiment, the position of the reticle stage can be reliably measured without holding by the reticle stage the bar mirror which becomes longer in proportion to the stroke. This can minimize the size of the reticle stage regardless of the size of the bar mirror. Since the detectors are arranged outside the stage, no optical cable or the like need be laid out on the stage, and the whole reticle stage can be reduced in size and weight.

(Second Embodiment)

Figure 2:
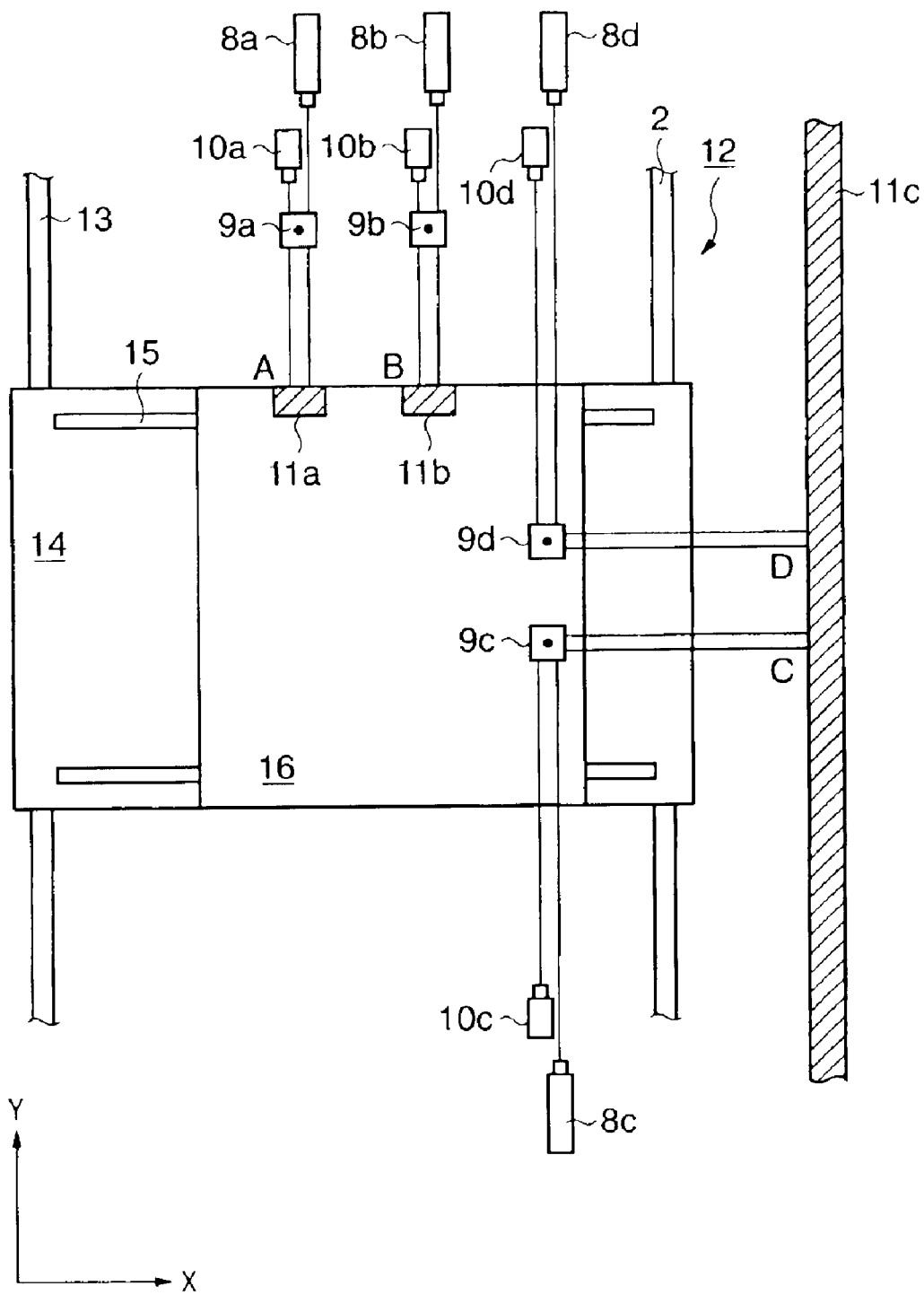
FIG. 2 is a view showing a stage apparatus according to the second embodiment of the present invention.

FIG. 2 shows an interferometer-mounted stage according to the second embodiment.

In the first embodiment, the stage 1 has a one-plate structure, is supported on the guide 2 in three axial directions, and is movable in the three axial directions. In the second embodiment, a stage has a stacked structure, and is mounted on a Y stage which moves with a long stroke along the Y-axis. The stage is movable with a short stroke in the X and θ directions on the Y stage. That is, the stage is movable in the three axial directions including Y-axis movement of the Y stage.

FIG. 2 shows an interferometer-mounted stage which is a triaxial stage having X-, Y-, and θ-axes with a degree of freedom in the plane direction. In this stage, the stroke is long along the Y-axis, and short along the θ-axis and the X-axis perpendicular to the Y-axis. The bar mirror of a laser interferometer for measuring the long-stroke axis (Y-axis) is mounted on a stage movable portion, and its optical unit and detector are arranged outside the stage movable portion. The optical unit of a laser interferometer for measuring the short-stroke axes (X- and θ-axis) is mounted on a stage movable portion, and its bar mirror and detector are arranged outside the stage movable portion.

In FIG. 2, an X-Y stage 12 comprises a rectangular Y table 14 movable in the Y-axis direction along a pair of rails 13 extending parallel to the Y-axis, and a rectangular X table 16 movable in the X-axis direction along a pair of rails 15 laid parallel to the X-axis on the Y table 14. A substrate is held on the X table 16.

A laser interferometer is generally constituted by an optical unit which receives a laser beam from a light source, splits it into reference and measurement beams, ensures the optical path of the reference beam, and causes the reference and measurement beams to interfere with each other, a bar mirror for reflecting the measurement beam, a detector for detecting the interference beam, and the like.

Laser heads 8a and 8b each for generating a laser beam, optical units (interferometers) 9a and 9b each for splitting the laser beam into reference and measurement beams and ensuring the optical path of the reference beam, and detectors 10a and 10b each for detecting the reference and measurement beams are arranged outside the X-Y stage 12. Bar mirrors 11a and 11b for reflecting the measurement beams of laser beams and returning them to the optical units (interferometers) 9a and 9b are fixed at one side edge which faces the optical units (interferometers) 9a and 9b of the X table 16 which moves along the Y-axis on the Y table 14, thus constituting a Y-axis laser interferometer. Note that the members (11a and 11b) for reflecting the measurement beams are not limited to the bar mirrors and may be corner cubes. The bar mirrors 11a and 11b are long enough for the measurement beams not to fall outside them even if the X table 16 moves with a short stroke along the X-axis.

Laser heads 8c and 8d each for generating a laser beam, and detectors 10c and 10d each for detecting reference and measurement beams are arranged outside the X-Y stage 12. Optical units (interferometers) 9c and 9d each for splitting a laser beam into reference and measurement beams and ensuring the optical path of the reference beam are mounted on the X-Y stage 12. The X table 16 moves with a short stroke along the X-axis. Even if the X table 16 moves along the X-axis, laser beams from the laser heads 8c and 8d do not fall outside the optical units (interferometers) mounted on the X table 16.

A long bar mirror 11c which extends along the Y-axis, faces the optical units (interferometers) 9c and 9d on the X table 16, and reflects the measurement beam of a laser beam to return it to the optical units (interferometers) 9c and 9d is fixed outside the Y table 14, thereby constituting an X-axis laser interferometer. The bar mirror 11c is desirably supported at its Bessel point because it is long along the Y-axis.

These Y-axis and X-axis laser interferometers measure the positions of the X and Y tables 16 and 14 and that of the substrate. More specifically, laser beams emitted by the laser heads 8a, 8b, 8c, and 8d are guided to the optical units (interferometers) 9a, 9b, 9c, and 9d where each laser beam is split into reference and measurement beams. The reference beams are repetitively reflected within the interferometers 9a, 9b, 9c, and 9d and guided to the detectors 10a, 10b, 10c, and 10d. The measurement beams emerge from the optical units (interferometers) 9a, 9b, 9c, and 9d, reach the bar mirrors 11a and 11b held by the X table 16 and the bar mirror 11c arranged outside the Y table 14, and are reflected to return to the optical units (interferometers) 9a, 9b, 9c, and 9d. The measurement beams reach the bar mirrors 11a, 11b, and 11c again, are reflected, and guided to the detectors 10a, 10b, 10c, and 10d via the optical units (interferometers) 9a, 9b, 9c, and 9d.

The optical paths until the reference beams are incident on the detectors 10a and 10b are constant regardless of the position of the Y table 14. The optical paths until the measurement beams are incident on the detectors 10a and 10b depend on the Y-axis positions of the bar mirrors 11a and 11b on the X table 16 that reflect the measurement beams, and the measurement beams contain position information of the Y table 14. These optical paths are compared to measure distances y between the optical units (interferometers) 9a and 9b along the Y-axis and the bar mirrors 11a and 11b at points A and B where the bar mirrors 11a and 11b held by the X table 16 reflect the measurement beams, and the position of the Y table 14.

Laser beams from the laser heads 8c and 8d are respectively guided to the optical units (interferometers) 9c and 9d. Each of the laser beams guided to the optical units (interferometers) 9c and 9d is split into reference and measurement beams. The measurement beams reciprocate twice between the optical units (interferometers) 9c and 9d and the bar mirror 11c, while the reference beams are repetitively reflected within the respective optical units (interferometers) 9c and 9d. Then, the reference and measurement beams are guided to the detectors 10c and 10d. Distances x1 and x2 between the optical units (interferometers) 9c and 9d and the bar mirror 11c along the X-axis at points C and D where the bar mirror 11c reflects the laser beams, and the position of the X table 16 including the two points can be measured from the reference and measurement beams guided to the detectors 10c and 10d.

In the above description, the optical units 9c and 9d mounted on the X table 16 are interferometers where reference and measurement beams interfere with each other, and the interference beams irradiate the detectors 10c and 10d. However, the second embodiment suffices to split a laser beam into reference and measurement beams on the X table 16, and need not always make the reference and measurement beams interfere with each other on the X table 16. For example, the optical units mounted on the X table 16 may only multiplex reference and measurement beams without making them interfere with each other, and the detectors 10c and 10d arranged outside the X table 16 may make the reference and measurement beams interfere with each other.

The X-axis positions (distances) x1 and x2 of two points on the X table 16 and the Y-axis positions (distances) y1 and y2 of two points can provide the position of the X-Y stage 12 and the X-, Y-, and θ-axis positions of the substrate.

The X-axis position of the X table 16 is obtained from x1 and x2, but their average may be used as the X-axis position of the X table 16. Similarly, the Y-axis position of the Y table 14 is obtained from y1 and y2, but their average may be used as the Y-axis position of the Y table 14. The θ-axis position of the X table 16 is obtained from the positions x1 and x2 and the beam span, but is also to be obtained from the positions y1 and y2 and the beam span. Thus, θ-direction position information measured by the two methods may be averaged.

In FIG. 2, the X- and Y-axis directions are respectively measured by the two optical units (interferometers) 9a and 9b and the two optical units (interferometers) 9c and 9d, but both or one of the X- and Y-axis directions can also be measured by one optical unit. If the interferometer using one of the optical units (interferometers) 9c and 9d is eliminated from the arrangement of FIG. 2, the position of the X-Y stage 12 along the three axes (X-, Y-, and θ-axes) can be measured.

The θ-direction position of the Y table 14 can be calculated from the Y-axis positions y1 and y2 of two points on the Y table 14 and their spans, and the shape of the bar mirror 11c can be measured based on the calculated value and the positions x1 and x2. For this reason, the shape of the bar mirror 11c may be measured in advance to correct the measurement results of x1 and x2 serving as pieces of X-axis position information of two points on the X table 16 on the basis of the measurement result.

To measure the X-axis position of the X table 16 by using the bar mirror 11c, the optical units (interferometers) 9c and 9d each for splitting a laser beam into reference and measurement beams and ensuring that the optical path of the reference beam may not be mounted on the X table 16 but may be arranged outside the stage. In this case, the X table 16 is equipped with an optical element for irradiating the bar mirror 11c with a measurement beam from the optical unit (interferometer) that is incident from the Y-axis direction, and returning a measurement beam from the X-axis direction that is reflected by the bar mirror 11c to the optical unit (interferometer). In this arrangement, however, the optical path of the measurement beam is long, and a fluctuation in the atmosphere around the optical path caused by a temperature change generates a large measurement error. That is, the measurement result is readily influenced by the fluctuation because the optical path until the reference beam is incident on the detector is constant, but the measurement beam split by the optical unit (interferometer) arranged outside the X table 16 reaches the optical element mounted on the X-table via a long-stroke optical path along the Y-axis, is reflected by the mark mirror 11c to return to the optical element again, and reaches the optical unit via the long-stroke optical path along the Y-axis.

To the contrary, in the embodiment of FIG. 2, the optical units (interferometers) are mounted on the X table 16. Even if the atmosphere fluctuates between the laser heads 8c and 8d and the optical units (interferometers) 9c and 9d, the measurement result is hardly influenced. This is because an optical path common to reference and measurement beams is formed between the laser heads 8c and 8d and the optical units (interferometers) 9c and 9d (in other words, the optical path of the interference beam of the reference and measurement beams is formed between the laser heads 8c and 8d and the optical units (interferometers) 9c and 9d).

When, therefore, the X-axis position of the X table 16 is measured by using the bar mirror 11c arranged outside the X table 16, the measurement precision is higher in the arrangement in which the optical units (interferometers) are mounted on the X table 16, as shown in FIG. 2, than in the arrangement in which they are arranged outside the X table 16.

According to the second embodiment, the position of the X-Y stage 12 can be measured at high precision, and the stage can be aligned at high precision by controlling based on this measurement result the linear motors for driving the stage.

According to the second embodiment, the positions of the X and Y tables can be reliably measured without holding by the X-Y stage the bar mirror which becomes longer in proportion to the stroke. This can minimize the sizes of the X and Y tables regardless of the size of the bar mirror. Since the detectors are arranged outside the stage, no optical cable or the like need be laid out on the stage, and the whole X-Y stage can be reduced in size and weight. In the second embodiment, the X table 16 is movable with a short stroke in the X and θ directions on the Y table 14. However, this embodiment is not limited to this. For example, the X table 16 may be movable with a short stroke in only the X direction on the Y table 14, or may be movable with a short stroke in the X, Y, and θ directions.

(Third Embodiment)

Figure 3A:
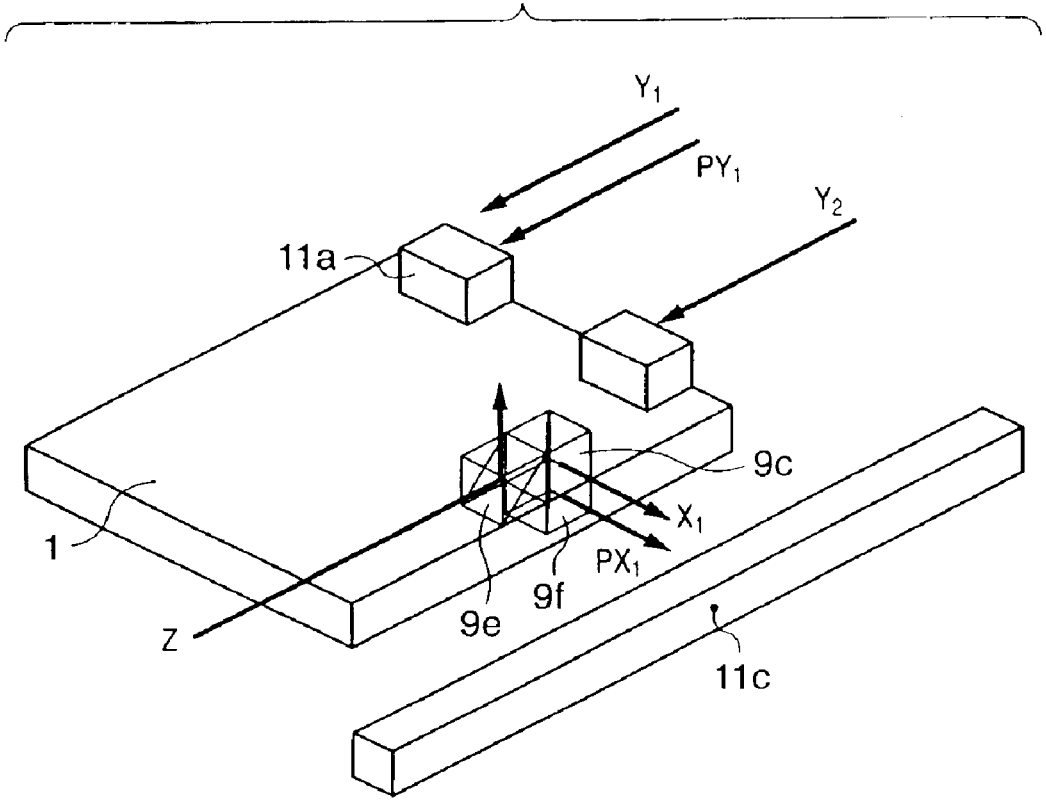
FIGS. 3A and 3B are views showing a stage apparatus according to the third embodiment of the present invention.
Figure 3B:
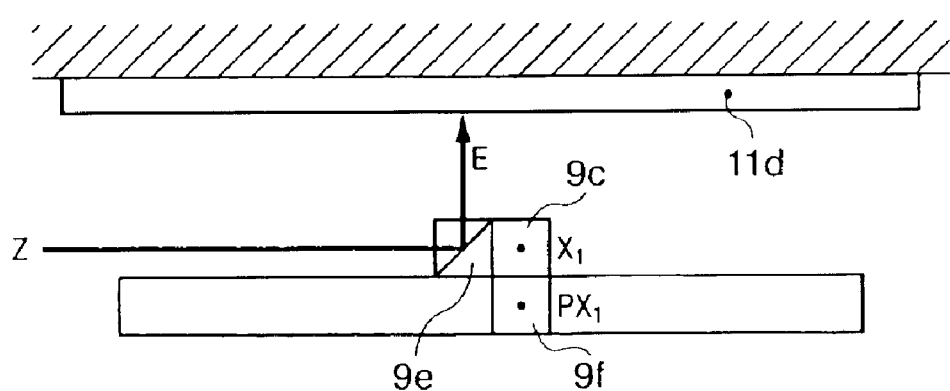

FIGS. 3A and 3B show an interferometer-mounted stage having six degrees of freedom. In this stage, the stroke is long along the Y-axis, and short along the X- and Z-axes. The bar mirror of a laser interferometer for measuring the long-stroke axis (Y-axis) is mounted on a stage movable portion, and its optical unit and detector are arranged outside the stage movable portion. The optical unit of a laser interferometer for measuring the short-stroke axes (X- and Z-axis) is mounted on a stage movable portion, and its bar mirror and detector are arranged outside the stage movable portion.

As shown in FIG. 3A, the long-stroke axis (Y-axis) is measured by the bar mirror mounted on the stage movable portion and the optical unit and detector arranged outside the stage movable portion. Another optical unit is mounted on the stage movable portion, and the short-stroke axis (X-axis) is measured by the bar mirror and detector arranged outside the stage movable portion. This is similar to the first embodiment, and a description thereof will be omitted.

In the third embodiment, an optical unit (interferometer) 9e for splitting a laser beam into reference and measurement beams and sending the measurement beam along the Z-axis is disposed adjacent to an optical unit (interferometer) 9c mounted on a reticle stage 1. A bar mirror 11d is arranged outside the stage movable portion along the Z-axis of the optical unit (interferometer) 9e. As shown in FIG. 3B, a distance z1 to a point E is measured by interference with this bar mirror.

In the third embodiment, an optical unit (interferometer) 9f for splitting a laser beam into reference and measurement beams and sending the measurement beam along the X-axis is disposed adjacent to the optical unit (interferometer) 9c mounted on the reticle stage. The measurement beam from the optical unit that irradiates a bar mirror 11c is formed at a predetermined interval from the measurement beam from the optical unit (interferometer) 9c in the Z direction. X-axis position information of the reticle stage 1 and ω y (Y-axis position information) of the reticle stage 1 can be obtained on the basis of obtained information PX1, X-axis position information X1 obtained by using the optical unit (interferometer) 9c, and the beam spans of the two measurement beams in the Z direction. Note that X-axis position information of the reticle stage 1 may be obtained by averaging the pieces of position information PX1 and X1.

In the third embodiment, an optical unit (interferometer) for splitting a laser beam into reference and measurement beams and sending the measurement beam along the Y-axis is disposed adjacent to an optical unit (interferometer) 9a arranged outside the reticle stage. The measurement beam from the optical unit that irradiates a bar mirror 11a is formed at a predetermined interval from the measurement beam from the optical unit (interferometer) 9a in the Z direction. Y-axis position information of the reticle stage 1 and ω x (X-axis position information) of the reticle stage 1 can be obtained on the basis of obtained information PY1, Y-axis position information Y1 obtained by using the optical unit (interferometer) 9a, and the beam spans of the two measurement beams in the Z direction. Note that Y-axis position information of the reticle stage 1 may be obtained by averaging the pieces of position information PY1 and Y1.

The six degrees of freedom of the stage are measured by data obtained from these interferometers.

(Fourth Embodiment)

Figure 4:
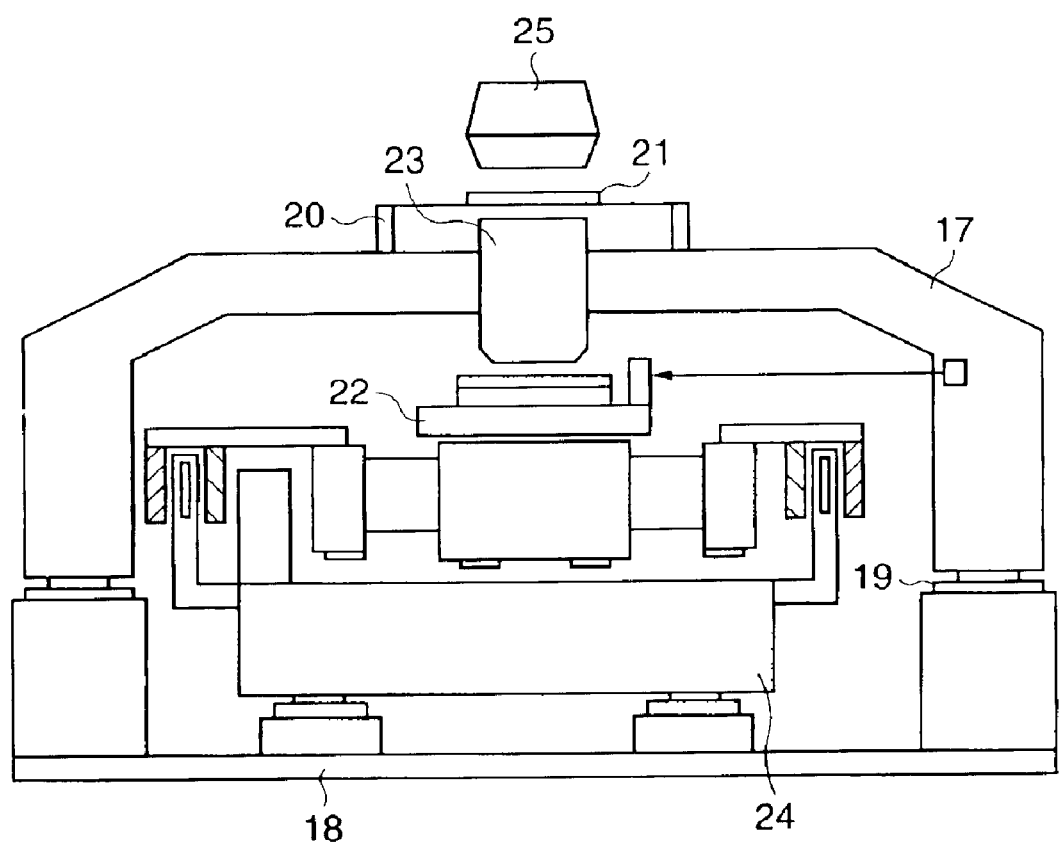
FIG. 4 is a sectional view showing an exposure apparatus having a stage apparatus according to the fourth embodiment of the present invention.
Figure 5:
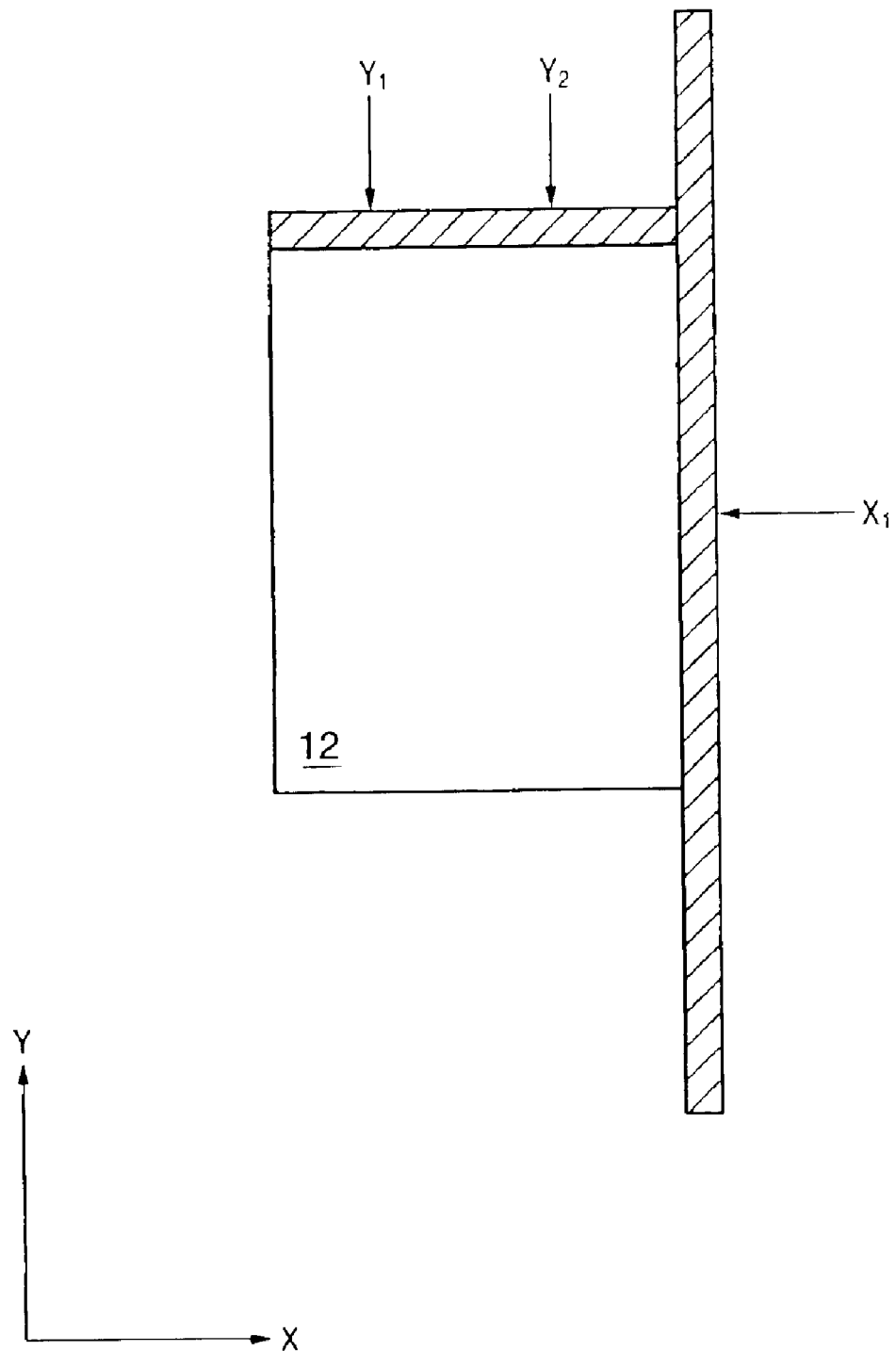
FIG. 5 is a view showing the measurement principle of a conventional stage apparatus.
Figure 6:
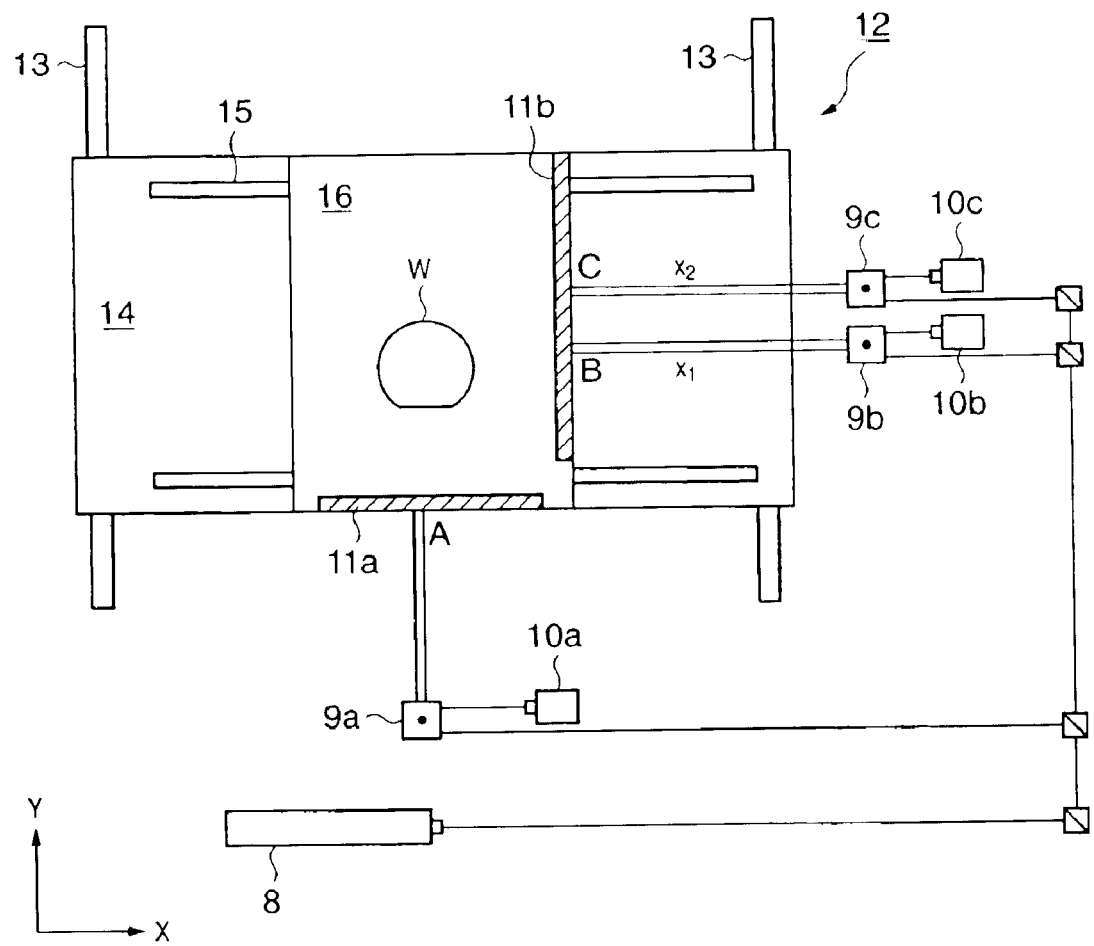
FIG. 6 is a view showing the conventional stage apparatus.

An embodiment of a scanning exposure apparatus on which the interferometer-mounted stage apparatus of the first embodiment is mounted as a reticle stage will be explained with reference to FIG. 4.

A lens barrel surface plate 17 is supported by a floor or base 18 via a damper 19. The lens barrel surface plate 17 supports a reticle stage surface plate 20 and a projection optical system 23 which is positioned between a reticle stage 21 and a wafer stage 22.

The wafer stage 22 is supported by a stage surface plate 24 supported by the floor or base, and supports and aligns a wafer. The reticle stage 21 is supported by the reticle stage surface plate 20 supported by the lens barrel surface plate 17, and movably supports a reticle bearing a circuit pattern. The bar mirror of the first embodiment is integrated with the lens barrel surface plate 17. An illumination optical system 25 generates exposure light for exposing the wafer on the wafer stage 22 to the reticle set on the reticle stage 21.

The wafer stage 22 is scanned in synchronism with the reticle stage 21. During scan of the reticle and wafer stages 21 and 22, their positions are continuously detected by corresponding interferometers and fed back to the driving units of the reticle and wafer stages 21 and 22. This enables accurately synchronizing the scan start positions of the reticle and wafer stages 21 and 22 and controlling the scan speed in a constant-speed scan region at high precision. While the reticle and wafer stages 21 and 22 are scanned with respect to the projection optical system 23, the wafer is exposed to the reticle pattern, and the circuit pattern is transferred.

The fourth embodiment adopts the interferometer-mounted stage apparatus of the first embodiment as a reticle stage. Thus, the stage position can be measured by using the projection optical system as a reference, and high-speed, high-precision exposure can be realized.

<Embodiment of Semiconductor Production System>

A production system for producing a semiconductor device (e.g., a semiconductor chip such as an IC or LSI, a liquid crystal panel, a CCD, a thin-film magnetic head, a micromachine, or the like) will be exemplified. A trouble remedy or periodic maintenance of a manufacturing apparatus installed in a semiconductor manufacturing factory, or maintenance service such as software distribution is performed by using, e.g., a computer network outside the manufacturing factory.

Figure 7:
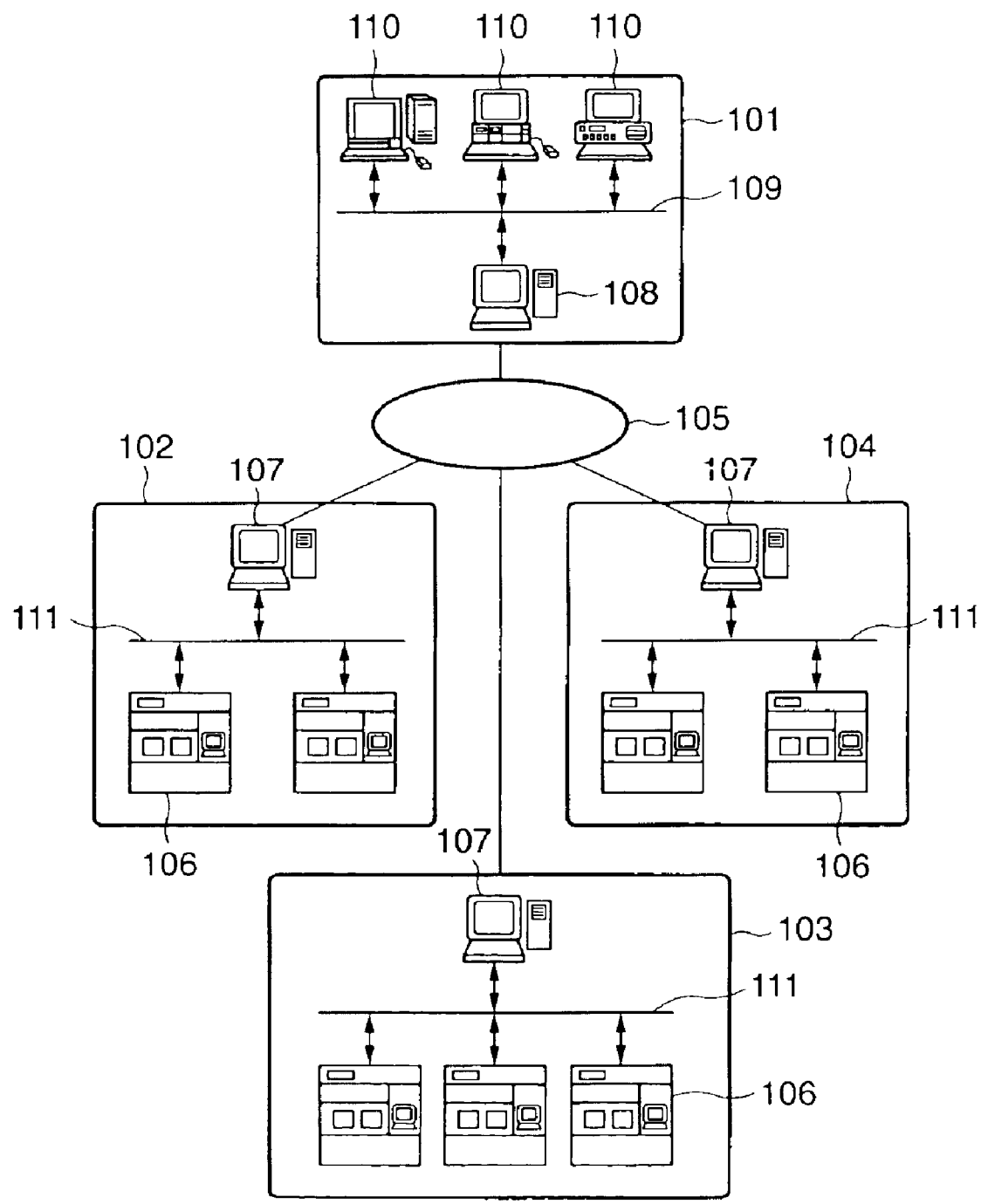
FIG. 7 is a view showing the concept of a semiconductor device production system when viewed from a given angle.

FIG. 7 shows the overall system cut out at a given angle. In FIG. 7, reference numeral 101 denotes a business office of a vendor (e.g., an apparatus supply manufacturer), which provides a semiconductor device manufacturing apparatus. Assumed examples of the manufacturing apparatus are semiconductor manufacturing apparatuses for performing various processes used in a semiconductor manufacturing factory, such as pre-process, and apparatuses (e.g., a lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 101 comprises a host management system 108 for providing a maintenance database for the manufacturing apparatus, a plurality of operation terminal computers 110, and a LAN (Local Area Network) 109, which connects the host management system 108 and computers 110 to build an intranet. The host management system 108 has a gateway for connecting the LAN 109 to Internet 105 as an external network of the business office, and a security function for limiting external access.

Reference numerals 102 to 104 denote manufacturing factories of the semiconductor manufacturer as users of manufacturing apparatuses. The manufacturing factories 102 to 104 may belong to different manufacturers or the same manufacturer (e.g., a pre-process factory, a post-process factory, and the like). Each of the factories 102 to 104 is equipped with a plurality of manufacturing apparatuses 106, a LAN (e.g., a Local Area Network) 111, which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 as an external network of the factory. Each factory can access the host management system 108 of the vendor 101 from the LAN 111 via the Internet 105. The security function of the host management system 108 authorizes access of only a limited user. More specifically, the factory notifies the vendor via the Internet 105 of status information (e.g., the symptom of a manufacturing apparatus in trouble) representing the operation status of each manufacturing apparatus 106, and receives response information (e.g., information designating a remedy against the trouble, or remedy software or data) corresponding to the notification or maintenance information such as the latest software or help information. Data communication between the factories 102 to 104 and the vendor 101 and data communication via the LAN 111 in each factory adopt a communication protocol (TCP/IP) generally used in the Internet. Instead of using the Internet as an external network of the factory, a dedicated network (e.g., an ISDN) having high security, which inhibits access of a third party, can be adopted. Also, the user may construct a database in addition to the one provided by the vendor and set the database on an external network, and the host management system may authorize access to the database from a plurality of user factories.

Figure 8:
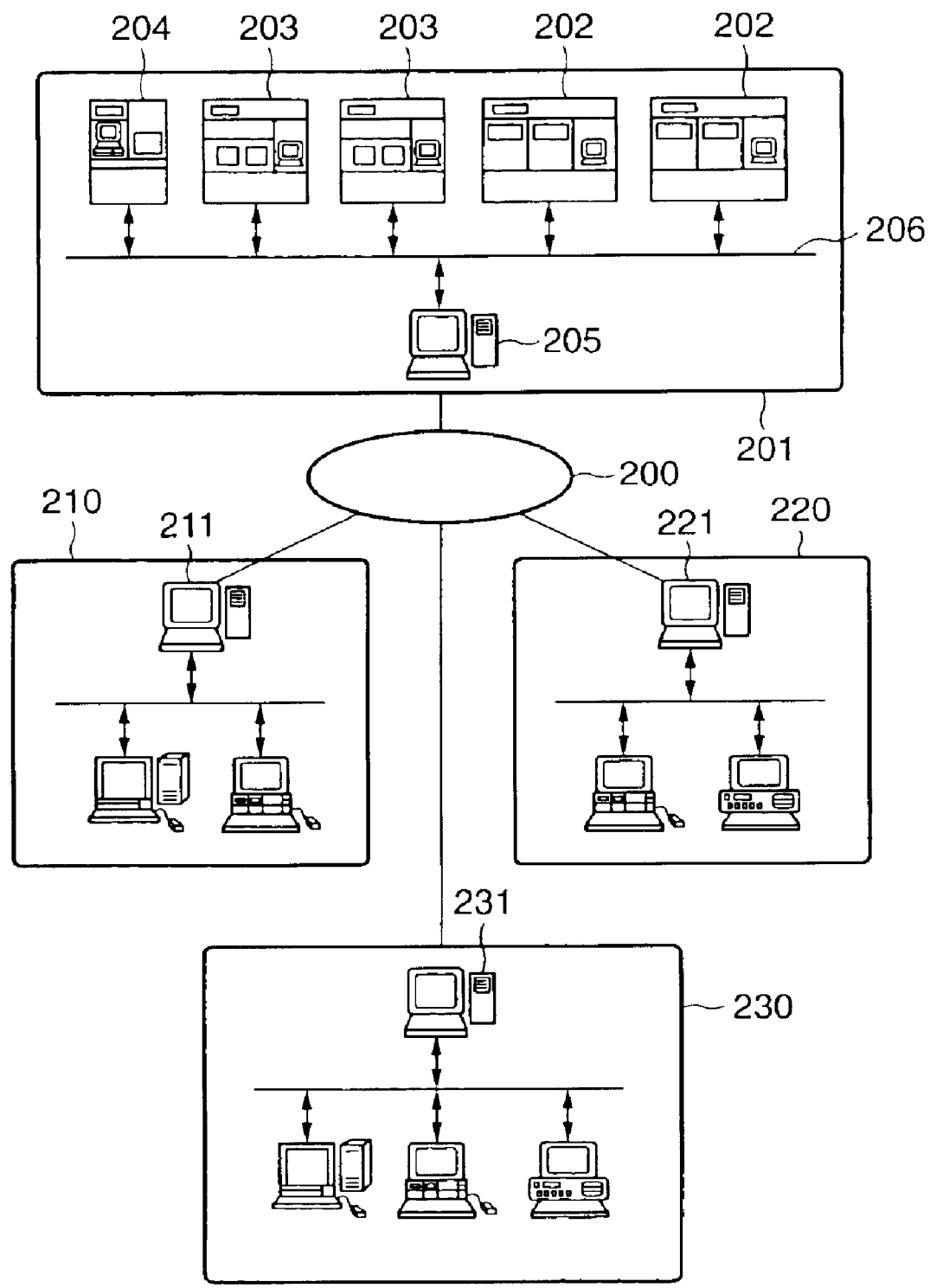
FIG. 8 is a view showing the concept of the semiconductor device production system when viewed from another given angle.

FIG. 8 is a view showing the concept of the overall system of this embodiment that is cut out at a different angle from FIG. 7. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 8, a factory having apparatuses of a plurality of vendors and the management systems of the vendors for these manufacturing apparatuses are connected via the external network of the factory, and maintenance information of each manufacturing apparatus is communicated. In FIG. 8 reference numeral 201 denotes a manufacturing factory of a manufacturing apparatus user (e.g., a semiconductor device manufacturer) where manufacturing apparatuses for performing various processes, e.g., an exposure apparatus 202, a resist processing apparatus 203, and a film formation apparatus 204 are installed in the manufacturing line of the factory. FIG. 8 shows only one manufacturing factory 201, but a plurality of factories are networked in practice. The respective apparatuses in the factory are connected to a LAN 206 to build an intranet, and a host management system 205 manages the operation of the manufacturing line. The business offices of vendors (e.g., apparatus supply manufacturers) such as an exposure apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221, and 231 of the vendors for the respective apparatuses are connected via the Internet or dedicated network serving as an external network 200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 200. This can minimize stoppage of the manufacturing line.

Each manufacturing apparatus in the semiconductor manufacturing factory comprises a display, a network interface, and a computer for executing network access software and apparatus operating software, which are stored in a storage device. The storage device is a built-in memory, a hard disk, or a network file server. The network access software includes a dedicated or general-purpose web browser, and provides a user interface having a window as shown in FIG. 9 on the display. While referring to this window, the operator who manages the manufacturing apparatuses in each factory inputs, in input items on the windows, pieces of information such as the type of manufacturing apparatus (401), serial number (402), subject of trouble (403), occurrence date (404), degree of urgency (405), symptom (406), remedy (407), and progress (408). The pieces of input information are transmitted to the maintenance database via the Internet, and appropriate maintenance information is sent back from the maintenance database and displayed on the display. The user interface provided by the web browser realizes hyperlink functions (410 to 412), as shown in FIG. 9. This allows the operator to access detailed information of each item, receive the latest-version software to be used for a manufacturing apparatus and from a software library provided by a vendor, and receive an operation guide (help information) as a reference for the operator in the factory. Maintenance information provided by the maintenance database also includes information concerning the features of the present invention described above. The software library also provides the latest software for implementing the features of the present invention.

Figure 10:
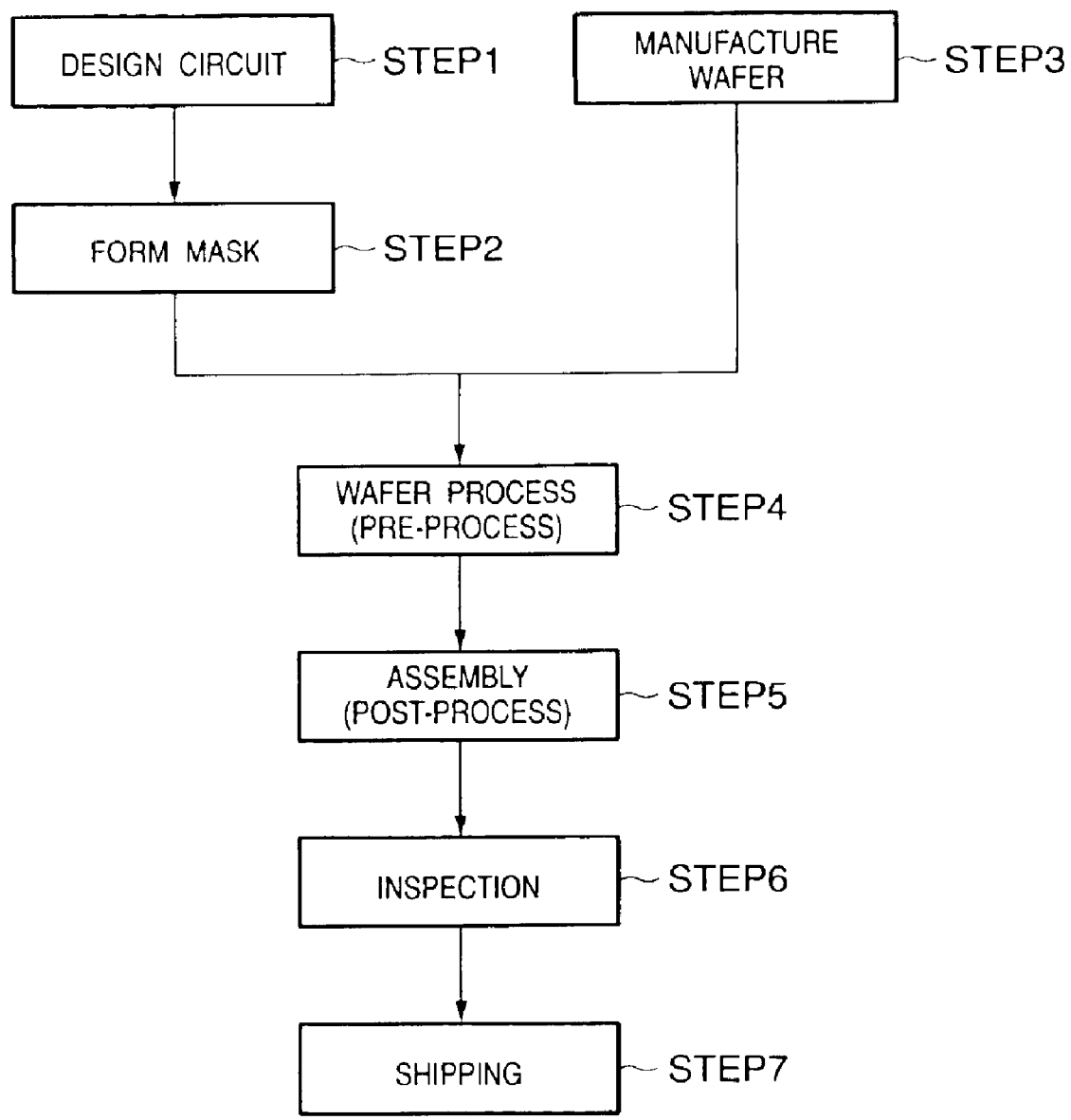
FIG. 10 is a flow chart showing a device manufacturing process.

A semiconductor device manufacturing process using the above-described production system will be explained. FIG. 10 shows the flow of the whole manufacturing process of the semiconductor device. In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process) called a pre-process, an actual circuit is formed on the wafer by lithography using a prepared mask and the wafer. Step 5 (assembly), called a post-process, is the step of forming a semiconductor chip by using the wafer manufactured in step 4, and includes an assembly process (dicing and bonding) and a packing process (chip encapsulation). In step 6 (inspection), inspections such as the operation confirmation test and durability test of the semiconductor device manufactured in step 5 are conducted. After these steps, the semiconductor device is completed and shipped (step 7). For example, the pre-process and post-process are performed in separate dedicated factories, and maintenance is done for each of the factories by the above-described remote maintenance system. Information for production management and apparatus maintenance is communicated between the pre-process factory and the post-process factory via the Internet or dedicated network.

Figure 11:
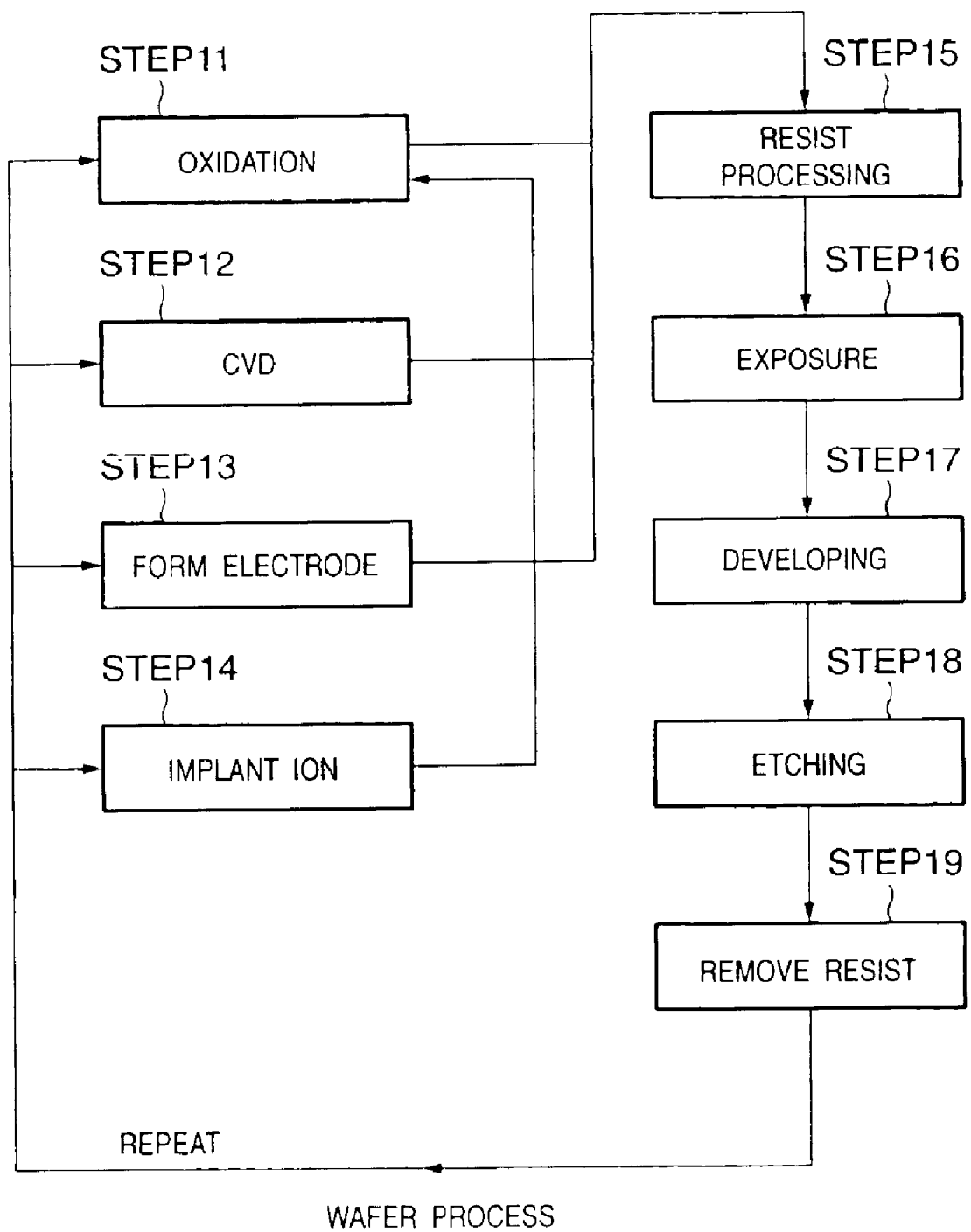
FIG. 11 is a flow chart for explaining a wafer process.

FIG. 11 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

The present invention is not limited to the above embodiments and various changes and modifications can be made within the spirit and scope of the present invention. Therefore, to apprise the public of the scope of the present invention the following claims are made.

What is claimed is:

1. An exposure apparatus comprising:
   as a reticle stage and/or a wafer stage, a stage apparatus having a stage movable at least on a long stroke along a first direction and a short stroke along a second direction, a first optical unit which is arranged outside the stage and splits a first laser beam for measuring a position of the stage in the first direction into first reference and measurement beams, a second optical unit which splits a second laser beam for measuring a position of the stage in the second direction into second reference and measurement beams, a third optical unit which is arranged on the stage and irradiates a third laser beam along a third direction for measuring a position of the stage in the third direction perpendicular to each of the first and second directions, a first reflection unit which is arranged on the stage and reflects the first measurement beam, a second reflection unit which is arranged outside the stage and reflects the second measurement beam, a first detector which is arranged outside the stage and detects an interference beam of the first measurement and reference beams, and a second detector which is arranged outside the stage and detects an interference beam of the second measurement and reference beams.

2. A semiconductor device manufacturing method comprising the steps of:

installing, in a semiconductor manufacturing factory, manufacturing apparatuses for performing various processes, the manufacturing apparatuses including an exposure apparatus which includes as a reticle stage and/or a wafer stage, a stage apparatus having a stage movable at least in a long stroke along a first direction and a short stroke along a second direction, a first optical unit which is arranged outside the stage and splits a first laser beam for measuring a position of the stage in the first direction into first reference and measurement beams, a second optical unit which splits a second laser beam for measuring a position of the stage in the second direction into second reference and measurement beams, a third optical unit which is arranged on the stage and irradiates a third laser beam along a third direction for measuring a position of the stage in the third direction perpendicular to each of the first and second directions, a first reflection unit which is arranged on the stage and reflects the first measurement beam, a second reflection unit which is arranged outside the stage and reflects the second measurement beam, a first detector which is arranged outside the stage and detects an interference beam of the first measurement and reference beams, and a second detector which is arranged outside the stage and detects an interference beam of the second measurement and reference beams.

3. The method according to claim 2, further comprising:

connecting the manufacturing apparatuses by a local area network; and communicating information about at least one of the manufacturing apparatuses between the local area network and an external network outside the semiconductor manufacturing factory.

4. The method according to claim 3, further comprising performing one of (i) accessing a database provided by a vendor or user of the exposure apparatus via the external network to obtain maintenance information of the manufacturing apparatus by data communication, and (ii) performing production management by data communication between the semiconductor manufacturing factory and another semiconductor manufacturing factory via the external network.

5. A semiconductor manufacturing factory comprising:

manufacturing apparatuses, for performing various processes, the manufacturing apparatuses including an exposure apparatus which includes as a reticle stage and/or a wafer stage a stage apparatus having a stage movable at least in a long stroke along a first direction and a short stroke along a second direction, a first optical unit which is arranged outside the stage and splits a first laser beam for measuring a position of the stage in the first direction into first reference and measurement beams, a second optical unit which splits a second laser beam for measuring a position of the stage in the second direction into second reference and measurement beams, a third optical unit which is arranged on the stage and irradiates a third laser beam along a third direction for measuring a position of the stage in the third direction perpendicular to each of the first and second directions, a first reflection unit which is arranged on the stage and reflects the first measurement beam, a second reflection unit which is arranged outside the stage and reflects the second measurement beam, a first detector which is arranged outside the stage and detects an interference beam of the first measurement and reference beams, and a second detector which is arranged outside the stage and detects an interference beam of the second measurement and reference beams;

a local area network for connecting said manufacturing apparatuses; and a gateway which allows the local area network to access an external network outside the factory, wherein information about at least one of said manufacturing apparatuses can be communicated.

6. A maintenance method for an exposure apparatus which is installed in a semiconductor manufacturing factory, and includes as a reticle stage and/or a wafer stage a stage apparatus having a stage movable at least in a long stroke along a first direction and a short stroke along a second direction, a first optical unit which is arranged outside the stage and splits a first laser beam for measuring a position of the stage in the first direction into first reference and measurement beams, a second optical unit which splits a second laser beam for measuring a position of the stage in the second direction into second reference and measurement beams, a third optical unit which is arranged on the stage and irradiates a third laser beam along a third direction for measuring a position of the stage in the third direction perpendicular to each of the first and second directions, a first reflection unit which is arranged on the stage and reflects the first measurement beam, a second reflection unit which is arranged outside the stage and reflects the second measurement beam, a first detector which is arranged outside the stage and detects an interference beam of the first measurement and reference beams, and a second detector which is arranged outside the stage and detects an interference beam of the second measurement and reference beams, said method comprising the steps of:

causing a vendor or user of the exposure apparatus to provide a maintenance database connected to an external network of the semiconductor manufacturing factory;

authorizing access from the semiconductor manufacturing factory to the maintenance database via the external network; and transmitting maintenance information accumulated in the maintenance database to the semiconductor manufacturing factory via the external network.

7. A stage apparatus comprising:

a stage movable along at least a first direction and a second direction, wherein the stage is movable in a stroke along the first direction, which is longer than a stroke in the second direction;

a first optical unit which is arranged outside the stage and splits a first laser beam for measuring a position of the stage in the first direction into first reference and measurement beams;

a second optical unit which splits a second laser beam for measuring a position of the stage in the second direction into second reference and measurement beams;

a third optical unit which is arranged on the stage and irradiates a third laser beam along a third direction for measuring a position of the stage in the third direction perpendicular to each of the first and second directions; and an interferometer which measures a position of the stage, wherein said interferometer has a first reflection unit which is arranged on the stage and measures the stage in the first direction and a second reflection unit which is arranged outside the stage and measures the stage in the second direction.

8. The apparatus according to claim 7, wherein the first and second directions are perpendicular to each other.

9. The apparatus according to claim 7, wherein said stage is movable in a third direction perpendicular to the first and second directions.

10. The apparatus according to claim 9, further comprising an irradiator for emitting a measurement beam in the third direction.

11. The apparatus according to claim 9, wherein the position of said stage in a direction around an axis along the third direction is measured by using a measurement beam in the second direction.

12. The apparatus according to claim 7, wherein said stage is movable in a direction around an axis perpendicular to the first and second directions.

13. The apparatus according to claim 7, wherein a driving mechanism for driving said stage is controlled based on a measurement result of the position of said stage.

14. The apparatus according to claim 7, wherein said stage includes a reticle stage which supports a reticle.

15. The apparatus according to claim 7, wherein the second reflection unit includes a mirror which extends in the first direction.

16. The apparatus according to claim 7, further comprising:

a first optical unit which is arranged outside the stage and splits a first laser beam for measuring a position of the stage in the first direction into first reference and measurement beams;

a second optical unit which is arranged on the stage and splits a second laser beam for measuring a position of the stage in the second direction into second reference and measurement beams;

a first detector which is arranged outside the stage and detects an interference beam of the first measurement and reference beams; and a second detector which detects an interference beam of the second measurement and reference beams, wherein the first reflection unit reflects the first measurement beam, and the second reflection unit reflects the second measurement beam.

17. The apparatus according to claim 16, wherein the second detector is arranged outside the stage.

18. The apparatus according to claim 16, wherein said first and/or second optical unit makes the first and/or second reference beam and the first and/or second measurement beam interfere.

19. The apparatus according to claim 16, wherein said first and/or second detector makes the first and/or second reference beam and the first and/or second interference beam interfere.

20. The apparatus according to claim 16, wherein an incident direction of the second laser beam into said second optical unit and an irradiating direction of the second measurement beam from said second optical unit to said second reflection unit are perpendicular to each other.

21. The apparatus according to claim 16, wherein the incident direction of the second laser beam into said second optical unit is parallel to the first direction and an irradiating direction of the second measurement beam from said second optical unit to said second reflection unit is parallel to the second direction.

22. The apparatus according to claim 16, wherein the first measurement beam includes a plurality of measurement beams.

23. The apparatus according to claim 22, wherein a position of said stage in a direction around an axis perpendicular to the first and second directions is measured by using the first measurement beam.

24. The apparatus according to claim 22, wherein a position of said stage in a direction around an axis along the second direction is measured by using the first measurement beam.

25. The apparatus according to claim 16, wherein said second optical unit has a plurality of optical units on said stage.

26. The apparatus according to claim 25, wherein the position of said stage in the direction around the axis along the second direction is measured by using the second measurement beam.

27. The apparatus according to claim 25, wherein a shape of the second reflection unit is measured based on pieces of first direction position information of at least two points on said stage, and pieces of second direction position information of at least two points on said stage that are measured by using said second optical unit.

28. The apparatus according to claim 27, wherein the second direction position information on said stage that is measured by using said second optical unit is corrected based on a measurement result of the shape of the second reflection unit.

29. The apparatus according to claim 16, wherein the second reflection unit is supported at a Bessel point of the second reflection unit.

30. A stage apparatus comprising:

a stage movable at least in a long stroke along a first direction and a short stroke along a second direction; and an interferometer which measures a position of said stage, wherein said interferometer has a first reflection unit which is arranged on said stage and measures said stage in the first direction, a second reflection unit which is arranged outside said stage and measures said stage in the second direction and a third reflection unit which is arranged outside said stage and measures said stage in the third direction perpendicular to each of the first and second directions.

* * * * *